(12) United States Patent
Polcyn

(10) Patent No.: US 8,420,928 B2
(45) Date of Patent: Apr. 16, 2013

(54) USE OF PHOTOVOLTAICS FOR WASTE HEAT RECOVERY

(75) Inventor: Adam D. Polcyn, Pittsburgh, PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 538 days.

(21) Appl. No.: 12/031,303

(22) Filed: Feb. 14, 2008

(65) Prior Publication Data
US 2009/0205711 A1 Aug. 20, 2009

(51) Int. Cl.
*H01L 31/00* (2006.01)

(52) U.S. Cl.
USPC .......................................... 136/259; 136/252

(58) Field of Classification Search ............. 136/252, 136/259; 65/375
See application file for complete search history.

(56) References Cited

U.S. PATENT DOCUMENTS

| | | | |
|---|---|---|---|
| 2,054,382 A * | 9/1936 | Larsen et al. ................. | 250/226 |
| 3,476,945 A * | 11/1969 | Golden et al. ................ | 250/554 |
| 3,941,576 A | 3/1976 | Welton, Jr. | |
| 3,981,292 A | 9/1976 | Lilly et al. | |
| 3,981,293 A | 9/1976 | Gillery | |
| 4,045,197 A | 8/1977 | Tsai et al. | |
| 4,256,173 A | 3/1981 | Tsai et al. | |
| 4,282,023 A | 8/1981 | Hammel et al. | |
| 4,290,797 A | 9/1981 | Rossi | |
| 4,298,370 A | 11/1981 | Hammel | |
| 4,319,904 A | 3/1982 | Gullett | |
| 4,380,463 A | 4/1983 | Matesa | |
| 4,401,839 A * | 8/1983 | Pyle ............................. | 136/251 |
| 4,411,490 A * | 10/1983 | Daniel .......................... | 126/648 |
| 4,416,052 A * | 11/1983 | Stern ............................... | 438/64 |
| 4,836,862 A * | 6/1989 | Pelka et al. .................... | 136/253 |
| 5,217,539 A | 6/1993 | Fraas et al. | |
| 5,389,158 A | 2/1995 | Fraas et al. | |
| 5,594,548 A * | 1/1997 | Kobayashi et al. ........... | 356/602 |
| 6,053,974 A * | 4/2000 | Luter et al. .................... | 117/200 |
| 6,057,507 A | 5/2000 | Fraas et al. | |
| 6,095,682 A * | 8/2000 | Hollander et al. ............ | 374/121 |
| 6,177,628 B1 | 1/2001 | Fraas et al. | |

(Continued)

FOREIGN PATENT DOCUMENTS

JP 2006-045368 * 2/2006

OTHER PUBLICATIONS

Harunari, T., English language abstract of JP2006045368.*
Harunari, T., English machine translation of JP2006045368.*

(Continued)

*Primary Examiner* — Mark F Huff
*Assistant Examiner* — Tamir Ayad
(74) *Attorney, Agent, or Firm* — Andrew C. Siminerio

(57) ABSTRACT

A device for recovering waste heat in the form of radiated light, e.g. red visible light and/or infrared light includes a housing having a viewing window, and a photovoltaic cell mounted in the housing in a relationship to the viewing window, wherein rays of radiated light pass through the viewing window and impinge on surface of the photovoltaic cell. The housing and/or the cell are cooled so that the device can be used with a furnace for an industrial process, e.g. mounting the device with a view of the interior of the heating chamber of a glass making furnace. In this manner, the rays of the radiated light generated during the melting of glass batch materials in the heating chamber pass through the viewing window and impinge on the surface of the photovoltaic cells to generate electric current which is passed onto an electric load.

15 Claims, 8 Drawing Sheets

U.S. PATENT DOCUMENTS

| | | | |
|---|---|---|---|
| 6,232,545 | B1 | 5/2001 | Samaras et al. |
| 6,273,186 | B1 | 8/2001 | Ognibene et al. |
| 6,489,553 | B1 * | 12/2002 | Fraas et al. .................... 136/253 |
| 6,536,649 | B1 * | 3/2003 | Master et al. ................ 228/49.5 |
| 6,538,193 | B1 * | 3/2003 | Fraas ............................ 136/253 |
| 6,796,144 | B2 * | 9/2004 | Shepard et al. .............. 65/29.11 |
| 6,933,627 | B2 * | 8/2005 | Wilhelm ......................... 307/66 |

OTHER PUBLICATIONS

Polcyn, Adam D., U.S. Appl. No. 11/958,574, entitled "Heat Pipes and Use of Heat Pipes in Furnace Exhaust," filed Dec. 18, 2007.

Polcyn, Adam D., U.S. Appl. No. 11/958,565, entitled "A Device for Use in a Furnace Exhaust Stream for Thermoelectric Generation" filed Dec. 18, 2007.

Development of Front Surface, Spectral Control Filters with Greater Temperature Stability for Thermophotovoltaic Energy Conversion, Oct. 2, 2006, T. D. Rahmlow, Jr., D. M. DePoy, P. M. Fourspring, H. Ehsani, J. E. Lazo-Wasem and E. J. Gratiix.

Photovoltaics: Solar Electricity and Solar Cells in Theory and Practice, The Solarserver, Forum for Solar Energy, http://www.solarserver.de/wisson/photovoltaik-e.html.

TPV Generators Using the Radiant Tube Burner Configuration, L. M. Fraas et al, Issaquah, WA 98027, USA, www.jxcrystals.com/tpv/munich4.pdf.

Electromagnetic Spectrum, From Wikipedia, The Free Encyclopedia, http://en.wikipedia.org/wiki/Electromagnetic_spectrum.

* cited by examiner

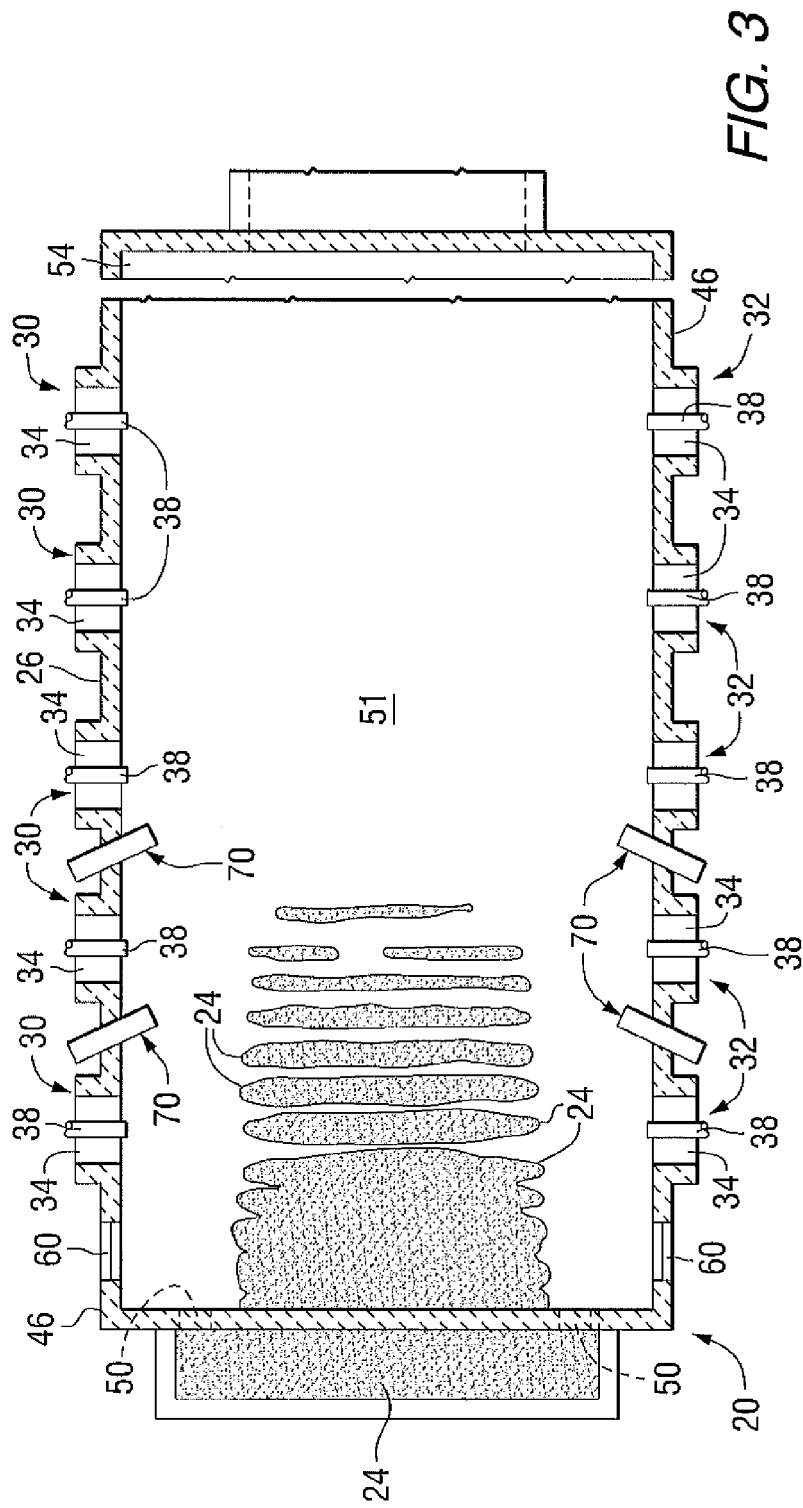
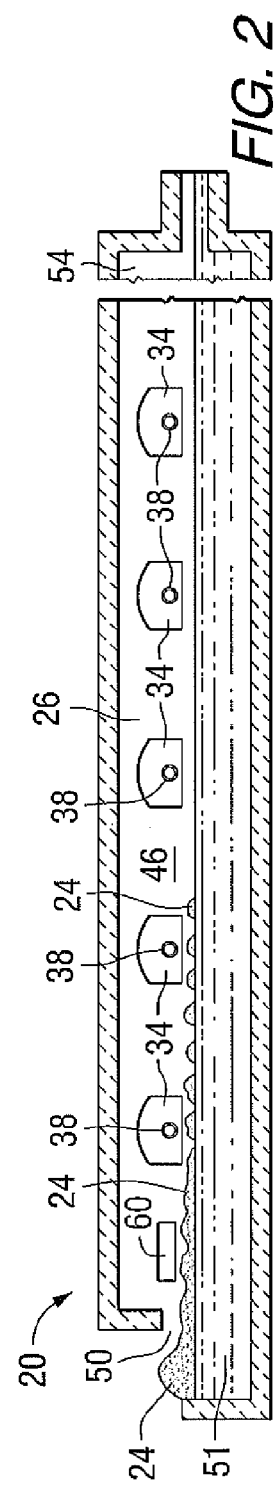
FIG. 3
FIG. 2

USE OF PHOTOVOLTAICS FOR WASTE HEAT RECOVERY

NOTICE OF GOVERNMENT SUPPORT

This invention was made with Government support under Contract No. DE-FC36-04GO14044 awarded by the Department of Energy. The United States government may have certain rights in this invention.

RELATED PATENT APPLICATIONS

This application is related to U.S. patent application Ser. No. 11/958,574 filed on Dec. 18, 2007 in the name of Adam D. Polcyn and titled HEAT PIPES AND USE OF HEAT PIPES IN FURNACE EXHAUST, and U.S. patent application Ser. No. 11/958,565 filed on Dec. 18, 2007 in the name of Adam D. Polcyn and titled A DEVICE FOR USE IN A FURNACE EXHAUST STREAM FOR THERMOELECTRIC GENERATION.

BACKGROUND OF THE INVENTION

1. Field of the Invention

This invention relates to the use of photovoltaics for waste heat recovery, and more particularly, to a device having photovoltaic cells, the device is mounted within and/or without the heating chamber of a furnace, e.g. a glass melting furnace, to convert waste heat in the form of visible red light and infrared light to electric energy 2. Discussion of Presently Available Technology It is known in the art of industrial processing that a significant amount of the energy generated by furnaces used in industrial processes, e.g. but not limiting to the discussion, furnaces for melting glass batch materials is lost in the furnace waste or exhaust gases, or lost in the wasted radiated heat. Techniques for recovering heat from the exhaust gases and using the heat to generate electricity and/or to power mechanical equipment are discussed in U.S. patent application Ser. No. 11/958,574 filed Dec. 18, 2007 in the name of Adam D. Polcyn and titled HEAT PIPES AND USE OF HEAT PIPES IN FURNACE EXHAUST; U.S. patent application Ser. No. 11/958,565 filed Dec. 18, 2007 in the name of Adam D. Polcyn and titled A DEVICE FOR USE IN A FURNACE EXHAUST STREAM FOR THERMOELECTRIC GENERATION; U.S. Pat. No. 6,538,193 B1 and report titled DEVELOPMENT OF FRONT SURFACE, SPECTRAL CONTROL FILTERS WITH GREATER TEMPERATURE STABILITY FOR THERMOPHOTOVOLTAIC ENERGY CONVERSION authored by T. D. Rahmlow, Jr., D. M. DePoy, P. M. Fourspring, H. Ehsani, J. E. Lazo-Wasem and E. J. Gratiix.

Although the devices and methods disclosed in the above documents are acceptable for recovering waste heat from the exhaust gases of a furnace, there are limitations. More particularly, the exhaust gases of the furnace carry particles, e.g. particles of the materials being melted, that deposit on the surface of the heat recovery device and form a thermal insulating layer thereby reducing the heat recovery efficiency of the device. Periodically the insulating layer has to be removed from the outer surface of the device, e.g. by removing the device from the furnace as disclosed in U.S. Pat. No. 6,538,193 and/or removing the insulating layer while the device is in situ as disclosed in the above mentioned U.S. patent application Ser. Nos. 11/958,574 and 11/958,565. Further, another limitation of the devices used to recover heat from the waste or exhaust gases is that they are limited to recover waste heat from the exhaust gases and recover little if any of the waste heat radiated into the heating chamber of the furnace.

As can be appreciated by those skilled in the art, it would be advantageous to provide a technique and/or device that recovers waste heat radiated into the heating chamber of the furnace; converts the recovered radiated heat or energy to another useable form of energy; does not have the limitations of the devices that recover waste heat from the exhaust gases, and can be used with or without the devices that recover waste heat from the exhaust gases.

SUMMARY OF THE INVENTION

This invention relates to a device for converting waste heat to a form of energy, e.g. electric energy, wherein the waste heat is in the form of radiated light, e.g. red visible and/or infrared light. The device includes, among other things, a housing having a viewing window, and a photovoltaic cell mounted in the housing wherein a surface of the photovoltaic cell is in a relationship to the viewing window, wherein rays of the red and/or infrared light pass through the viewing window and impinge on the surface of the photovoltaic cell.

The invention further relates to a furnace for an industrial process. The furnace includes, among other things, a heating chamber to heat materials, wherein during the heating of the materials waste heat is generated in the form of radiated light, e.g. red visible and/or infrared light, and a device for recovery of the waste heat in the form of red visible and/or infrared light. The device includes, among other things, a housing having a viewing window, and a photovoltaic cell mounted in the housing, wherein a surface of the photovoltaic cell is in a relationship to the viewing window, wherein rays of the red and/or infrared light pass through the viewing window and impinge on the surface of the photovoltaic cell.

The invention still further relates to a method of converting waste heat from an industrial process to another form of energy, e.g. electric energy. The method includes, among other things, operating the industrial process to heat materials, wherein during the operation of the industrial process, waste heat is generated in the form of radiated light, e.g. red visible and/or infrared light. Impinging rays of the red and/or infrared light onto a surface of a photovoltaic cell to generate electric current, and connecting the electric current to an electric load.

BRIEF DESCRIPTION OF THE DRAWINGS

FIG. 2 is a vertical section along the length of a glass melting furnace of the type shown in FIG. 1.

FIG. 3 is a horizontal section through the length of the glass melting furnace of the type shown in FIG. 1.

DESCRIPTION OF THE INVENTION

Figure 1:
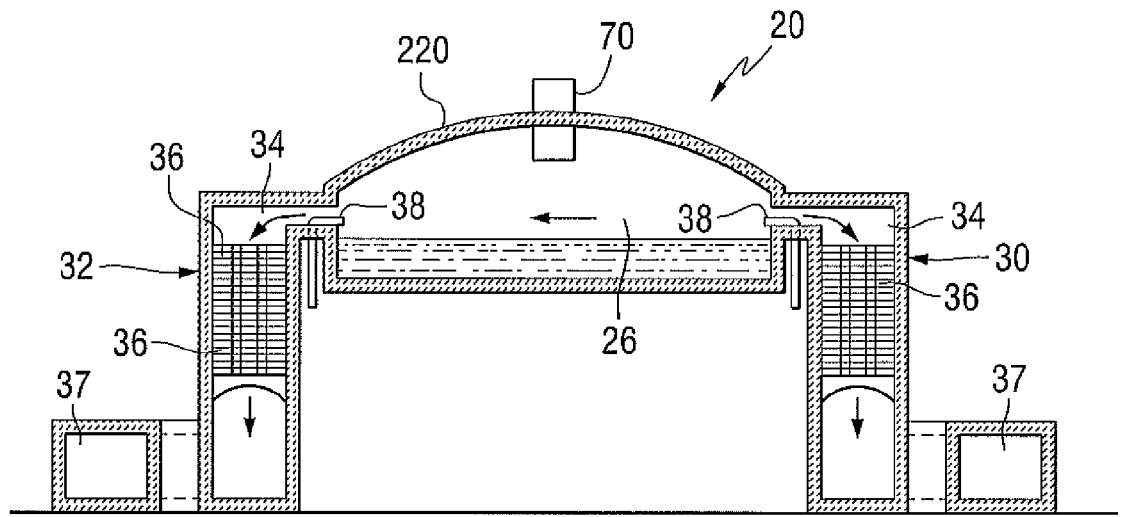
FIG. 1 is a schematic vertical section across the width of a cross-fired, regenerative furnace for melting glass batch materials and homogenizing molten glass, the furnace having devices of the invention mounted through the roof of the furnace.

As used herein, spatial or directional terms, such as "inner", "outer", "left", "right", "up", "down", "horizontal", "vertical", and the like, relate to the invention as it is shown in the drawing figures. However, it is to be understood that the invention can assume various alternative orientations and, accordingly, such terms are not to be considered as limiting. Further, all numbers expressing dimensions, physical characteristics, and so forth, used in the specification and claims are to be understood as being modified in all instances by the term "about". Accordingly, unless indicated to the contrary, the numerical values set forth in the following specification and claims can vary depending upon the desired property sought to be obtained by the present invention. At the very least, and not as an attempt to limit the application of the doctrine of equivalents to the scope of the claims, each numerical parameter should at least be construed in light of the number of reported significant digits and by applying ordinary rounding techniques. Moreover, all ranges disclosed herein are to be understood to encompass any and all subranges subsumed therein. For example, a stated range of "1 to 10" should be considered to include any and all subranges between and inclusive of the minimum value of 1 and the maximum value of 10; that is, all subranges beginning with a minimum value of 1 or more and ending with a maximum value of 10 or less, e.g., 1 to 6.7, or 3.2 to 8.1, or 5.5 to 10. Also, as used herein, the terms "mounted over", "positioned over", or "provided over" mean mounted, positioned, or provided on but not necessarily in surface contact with. For example, one article or component of an article "provided over" another article does not preclude the presence of materials between the articles, or between components of the article, respectively.

Before discussing several non-limiting embodiments of the invention, it is understood that the invention is not limited in its application to the details of the particular non-limiting embodiments shown and discussed herein since the invention is capable of other embodiments. Further, the terminology used herein to discuss the invention is for the purpose of description and is not of limitation. Still further, unless indicated otherwise, in the following discussion like numbers refer to like elements.

In the following discussion, non-limiting embodiments of the invention are discussed for use with a furnace for melting glass batch materials and/or homogenizing molten glass, however, it is understood that while furnaces for heating particular materials are being described as illustrative examples, the invention is not limited thereto and can be used on any type of furnace to heat any type of material, e.g. but not limited to, a glass forming chamber of the type used in the art to make float glass; furnaces for refining ores to metals; furnaces for changing physical properties of materials, e.g. but not limited to annealing glass and metals; furnaces for melting and/or making plastics, and furnaces for burning any type of materials, e.g. but not limited to wood, coal and gas.

Figure 4:
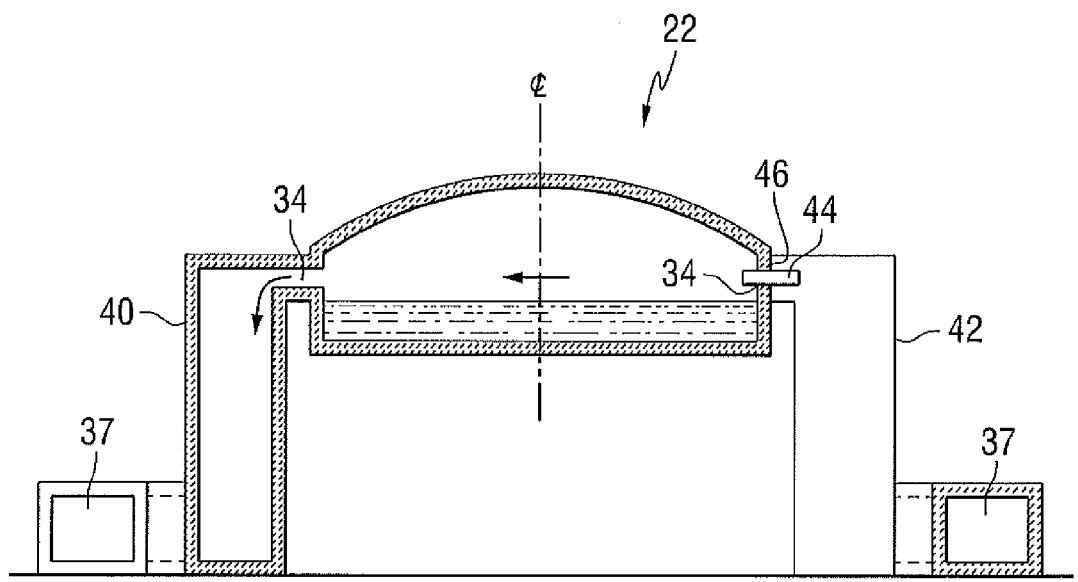
FIG. 4 is a schematic vertical step section across the width of an oxygen fired furnace for melting glass batch materials and homogenizing molten glass, the side to the left of the center line ("CL") in FIG. 4 is a cross section of the exhaust port and the side to the right of CL in FIG. 4 is a cross section of the furnace between the exhaust ports.

Although not limiting to the invention, shown in FIGS. 1-4 are two types of furnaces that can be used in the practice of the invention. Furnace 20 shown in FIGS. 1-3 is known in the art as a regenerative or Siemens furnace (FIG. 1 is similar to FIG. 1A of U.S. Pat. No. 4,256,173), and furnace 22 shown in FIG. 4 is known in the art as a regenerative furnace converted to an oxygen fired furnace. With reference to FIGS. 1-3 as needed, glass batch materials 24 (clearly shown in FIGS. 2 and 3) of the type used in the art to make float glass are melted in heating chamber 26 of the furnace 20. Regenerators 30 on one side of the heating chamber 24, and regenerators 32 on the opposite side of the heating chamber 26 go through a cycle including a firing period and a non-firing period to melt the glass batch materials 24 (see FIGS. 2 and 3). More particularly, when the regenerators on one side of the heating chamber 26, e.g. the regenerators 30 are in their firing period, the regenerators on the opposite side of the heating chamber 26, e.g. the regenerators 32 are in their non-firing period, and when the regenerators 30 are in their non-firing period, the regenerators 32 are in their firing period. During the non-firing period, heated exhaust gases from the heating chamber 26 move through ports 34 of the regenerators in the non-firing period, through checkers 36 (see FIG. 1) in the regenerators in the non-firing period, and out through the remaining part of the flue system of the regenerators, e.g. bypass flue 37 in the non-firing period. As the exhaust gases move over the checkers 36, the checkers are heated and the exhaust gases are cooled.

During the firing period, combustion gas, e.g. air is moved through the checkers 36 of the regenerators in the firing period to heat the combustion gas, and through the ports 34 of the regenerators in the firing period. As the combustion gas moves through the ports 34, it mixes with fuel from nozzles 38 mounted in the ports 34 (clearly shown in FIG. 3). The mixture is ignited and the flame of the ignited mixture is directed into the heating chamber 24 over the glass batch materials 24 to melt the glass batch materials and toward the ports 34 of the regenerators in the non-firing period. For a more detailed discussion of the operation of a regenerative furnace of the type shown in FIG. 1, reference can be made to U.S. Pat. No. 4,256,173, which patent is hereby incorporated by reference.

With reference to FIG. 4, the oxygen-fired furnace 22 shown in FIG. 4 is a regenerative furnace, e.g. of the type shown in FIG. 1-3 modified to be an oxygen fired furnace with the modifications of interest to this discussion including the absence of checkers 36 from the regenerators 30 and 32 to provide exhaust flues 40 and 42 (absence of the checkers 36 from the flues 40 and 42 clearly shown for the exhaust flue 40 shown on the left side of FIG. 4), and mounting fuel nozzles 44 through furnace wall 46 as shown at the right side of FIG. 4 at a position between ports 30 of the oxygen fired furnace. In the operation of the oxygen fired furnace 22, oxygen and fuel are mixed and fired from the position of the nozzles 44 (only one shown in FIG. 4). The flame of the ignited mixture is directed into the heating chamber 24 of the furnace 22 to melt the glass batch materials 24. The exhaust from the heating chamber 24 moves through the ports 34 at each side of the heating chamber 24 of the furnace 22 and through both of the exhaust flues 40 and 42, and the secondary flues 37 of the furnace 22.

With reference to FIGS. 2 and 3, an opening 50 is provided at the upstream end of the heating chamber 26 to move the batch materials 24 into the heating chamber 26 onto the molten glass 51 contained in the heating chamber 26. The invention is not limited to the equipment and/or the manner in which the batch materials 24 are moved into the heating chamber 26, and any method, equipment and/or device for moving glass batch materials into a heating chamber of a glass melting furnace, and/or to enhance melting of the glass batch materials, e.g. as disclosed in, but not limited to, U.S. Pat. Nos. 4,380,463; 4,319,904; 4,298,370; 4,290,797; 4,282,023; 4,045,197, and 3,941,576, which patents are hereby incorporated by reference, can be used in the practice of the invention.

The batch materials 24 melt as they move in a downstream direction on the molten glass 51 through the heating chamber 26. The molten glass 51 moves from the furnace 20 into a refiner 54 where the molten glass is homogenized, and thereafter, the homogenized molten glass is flowed from the refiner 54 onto a pool of molten metal contained in a glass forming chamber (not shown) of the type used in the process of shaping molten glass into a float flat glass ribbon.

As is appreciated by those skilled in the art, viewing ports or portholes are provided on each side of the heating chamber 26, the refiner 54 and the forming chamber (not shown) to view the operation of the glass making process. Of particular interest to this discussion are the viewing portholes of the heating chamber 26. In general, the viewing portholes are provided on each side of forming chamber with one viewing porthole 60 (clearly shown in FIGS. 2 and 3) adjacent the upstream end of the heating chamber 26, and the remaining viewing portholes (not shown) on a spacing of about 10 feet (3 meters) between adjacent portholes. The position and the number of viewing portholes in the furnace walls are not limiting to the invention, and the furnace can have any number of viewing portholes and/or any spacing between adjacent viewing portholes.

The temperature regime in the heating chamber 26 of the furnaces 20 and 22 is maintained between about 2600° F. to 2900° F. (1425° C. to 1595° C.) both above and below the batch materials as disclosed in one or more of the above-mentioned patents. As the glass batch materials are melted, long-wavelength visible and infrared energy is radiated to the surround areas of the heating chamber. For example, and not limiting to the invention, during the melting of the glass batch materials red visible energy, e.g. in the range of 600 nanometers ("nm") (0.60 microns) up to 700 nm (0.70 microns) of the electromagnetic spectrum, and infrared energy in the range of about 700 nm (0.70 microns) to 350,000 nm (350 microns) of the electromagnetic spectrum is radiated into the heating chamber. The near infrared (NIR) energy radiates as infrared light, and lies between the visible and microwave portions of the electromagnetic spectrum. For purposes of this discussion and not limiting to the invention, the NIR is in the range of 700 nm (0.70 microns) to 1500 nm (1.50 microns) of the electromagnetic spectrum. As used herein the term "radiated light" means energy in the range of 600 nm (0.60 microns) to 1500 nm (1.50 microns) of the electromagnetic spectrum.

As is appreciated, by those skilled in the art, photovoltaics or photovoltaic cells are composed of various semiconductor material which become electrically conductive when supplied with light, e.g. visible light or infrared light, and thermophotovoltaic (TPV) are composed of various semiconductor material which become electrically conductive when supplied with heat. TPV's are discussed in U.S. Pat. No. 6,538,193 B1. Of particular interest in this discussion are photovoltaics which become electrically conductive when radiated light impinges on the surface of the photovoltaic cell, and the discussion is directed to non-limiting embodiments of the invention to impinge the radiated light generated during the operation of an industrial process, e.g. melting glass batch materials, onto a photovoltaic cell.

The invention can be practiced using any of the type of photovoltaic cells known in the art that are made of a semiconductor material compatible to the wavelength of the radiated light generated by the heated materials, e.g. in this discussion the melting of glass batch materials. As is known in the art, photoelectric cells are made of semiconductor materials that are responsive to light, but operate as insulators at low temperatures. Usually, the semiconductor is silicon, which is doped with chemical elements with which one can obtain a surplus of negative either positive charged carriers (p-conducting semiconductor layer) or negative charged carriers (n-conducting semiconductor material) from the semiconductor material. When the differently contaminated semiconductor layers are combined a p-n-junction results on the boundary of the layers. At this junction, an interior electric field is built up which leads to the separation of the charged carriers that are released by light. Through metal contacts an electric charge can be tapped. If the outer circuit is closed, then direct current flows between the contacts. Silicon is the more common semiconductor material used to make photovoltaic cells. The cells can be as large as 7 inches by 7 inches (15 centimeter by 15 centimeters) and are usually 5 inches by 5 inches (10 cm by 10 cm). As is appreciated by those skilled in the art, the silicon can be monocrystalline silicon, polycrystalline silicon and amorphous silicon. Further, the invention is not limited to silicon and other semiconductor materials can be used in the practice of the invention, e.g. but not limited to, germanium, gallium arsenide, cadmium telluride and copper indium selenide.

In order to make appropriate voltages and outputs available for different applications, single cells are interconnected to form larger cells. Cells connected in series have a higher voltage while those connected in parallel produce more electric current. Although not limiting to the invention a device having a plurality of interconnected cells usually have the semiconductor material embedded in transparent Ethyl-Vinyl-Acetate fitted with an aluminum or stainless steel frame and covered with transparent substrate, e.g. but not limited to glass over the surface of the photovoltaic cell facing the energy source to protect the cell. Optionally a transparent antireflective film is applied over the glass surface to decrease the reflective loss on the cell surface. Photovoltaic cells are well known in the art and no further discussion is deemed necessary.

The high temperatures and the abrasive properties of the glass batch materials blown into the furnace atmosphere provide a hostile environment in the heating chamber 26 of the furnace 20 and/or 22. As is appreciated by those skilled in the art, as the distance from the upstream end of the heating chamber decreases, the intensity of the radiated light increases, and the temperature and the particles in the furnace atmosphere increase, and visa versa. The increased temperature increases the probability of thermal damage to, and/or reduced useable life of, the photovoltaic cell mounted in the heating chamber. To overcome the drawbacks of the hostile environment of the heating chamber and to maximize the intensity of the radiated light impinging on the photovoltaic cell, non-limiting embodiments of the invention include, but are not limited to, mounting a photovoltaic cell in a fluid cooled arrangement having a viewing window and (1) mounting the arrangement outside of the furnace with the photovoltaic cell in direct view of the radiated light; (2) mounting the arrangement within the heating chamber of the furnace, and (3) mounting the arrangement outside the furnace, and reflecting the radiated light within the furnace so as to impinge the reflected radiated light onto the arrangement outside the furnace.

Figure 5:
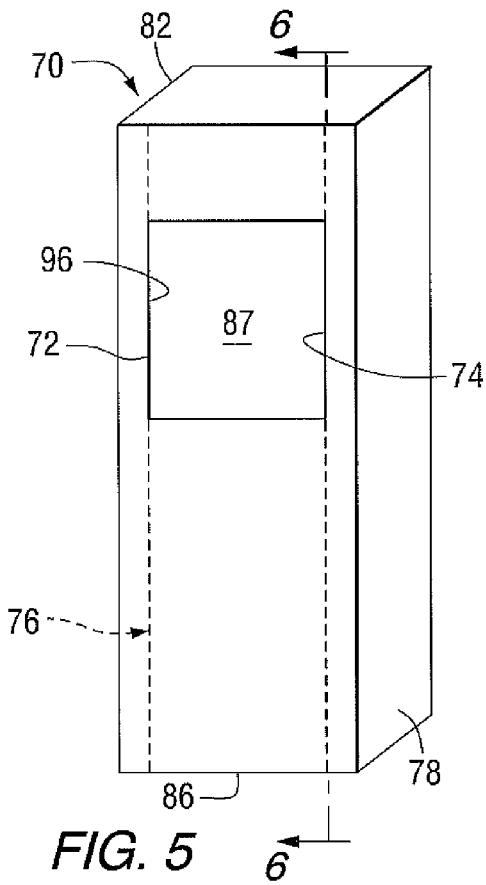
FIG. 5 is a front isometric view of a non-limiting embodiment of a conversion device of the invention.
Figure 6:
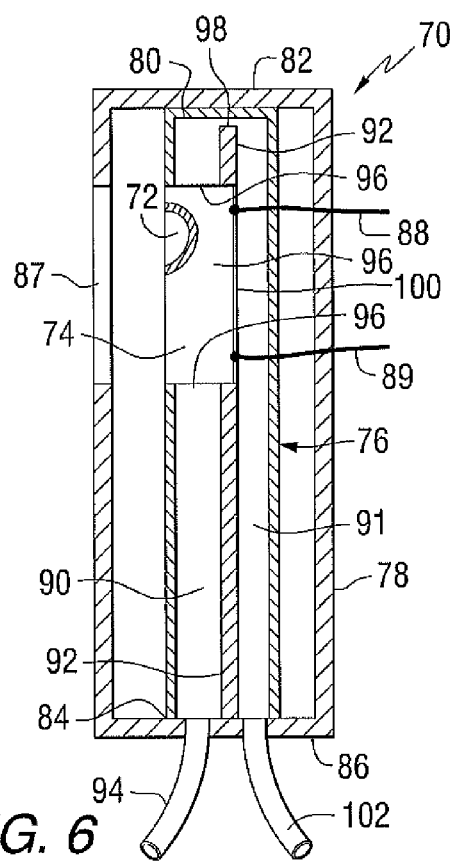
FIG. 6 is a view taken along lines 6-6 of FIG. 5.

With reference to FIGS. 5 and 6 as needed, there is shown one non-limiting embodiment of an arrangement 70 of the invention to protect the photovoltaic cell 72. In the following discussion the arrangement 70 will also be referred to as conversion device 70 for converting radiated light to another form of energy, e.g. electric energy. The photovoltaic cell 72 is mounted in recess 74 of fluid cooling jacket 76 mounted in a housing 78. The jacket 76 is secured at one end 80 to top side 82 of the housing 78, and opposite end 84 of the jacket 76 is secured to bottom side 86 of the housing 78 such that the photovoltaic cell 72 is aligned with viewing window 87. Wires 88 and 89 have one end connected to the metal contacts of the photovoltaic cell 72 and extend out of the housing 78 to provide external electrical access to the photovoltaic cell.

The jacket 76 has an inlet passageway or chamber 90 and an outlet passageway or chamber 91 separated by a baffle 92. A cooling medium, e.g. but not limited to chilled water, is moved into the inlet passageway 90 by way of conduit 94, through the inlet passageway 90 around outer side surfaces 96 of the recess 74 to end 98 of the baffle 92 adjacent the top 80 of the jacket 78. The water moves over the end 98 of the baffle 92 into the outlet passageway 91. As the water moves though the outlet passageway 91 it passes over back side 100 of the recess 74. The water flows toward the bottom side 86 of the housing 78, and out of the outlet passageway 91 by way of the conduit 102. As the water flows through the inlet and outlet passageways of the fluid cooling jacket 76, the photovoltaic cell 72 is cooled.

Figure 7:
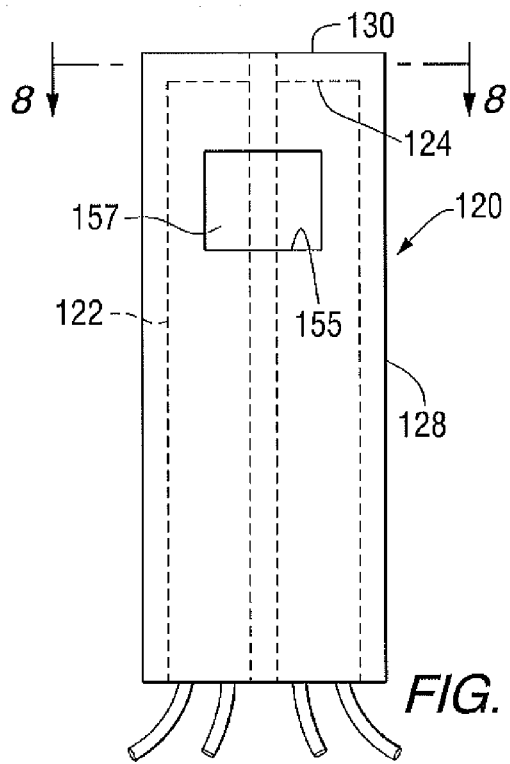
FIG. 7 is a front elevated view of a non-limited embodiment of a water cooled housing that can be used in the practice of the invention.
Figure 8:
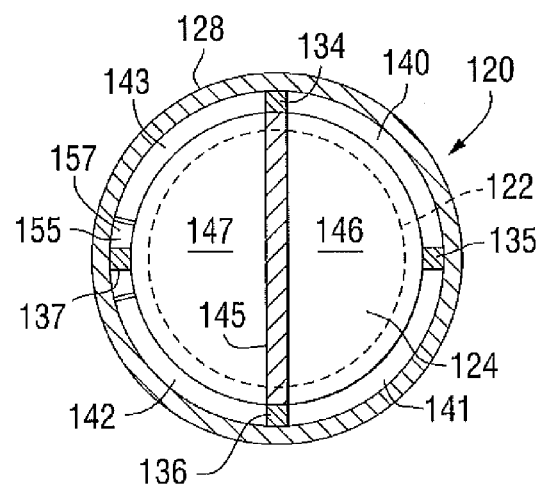
FIG. 8 is a view taken along lines 8-8 of FIG. 7.
Figure 9:
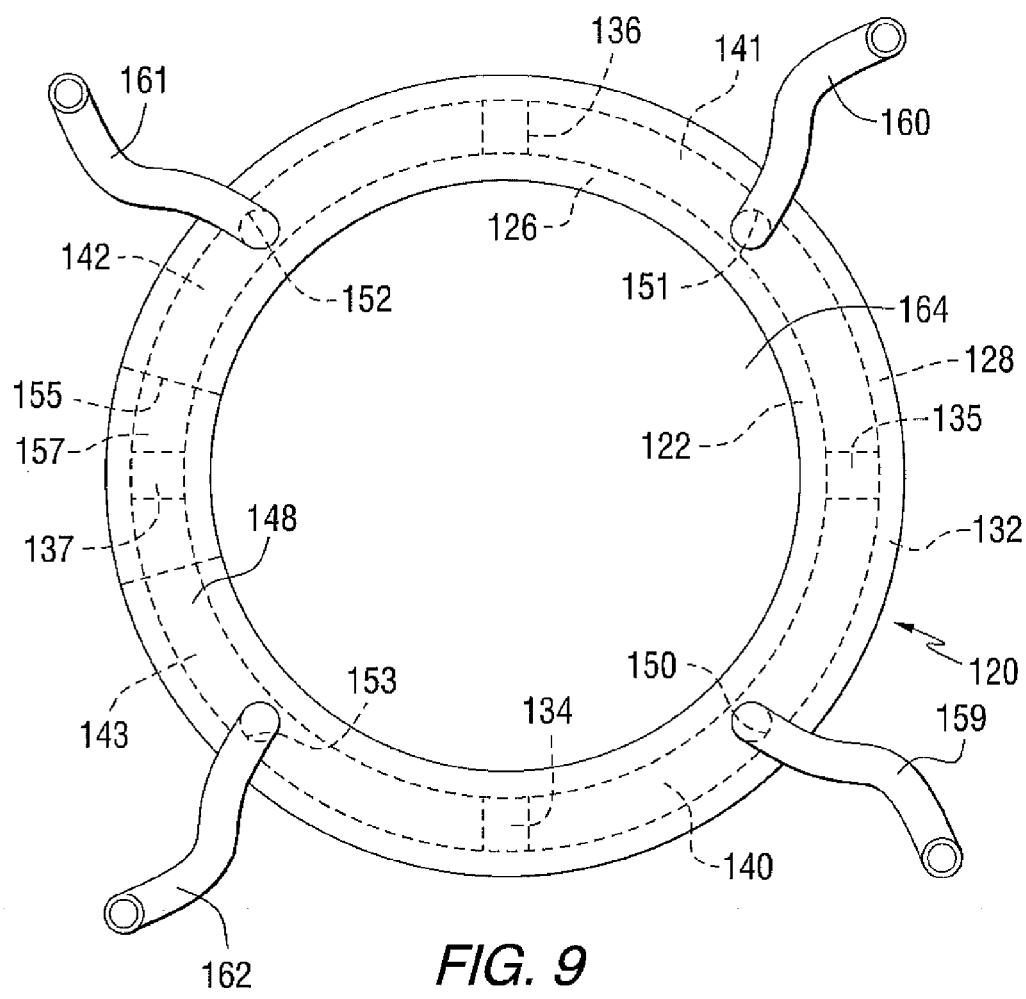
FIG. 9 is a bottom elevated view of the housing shown in FIG. 7.

Shown in FIGS. 7-9 is a non-limiting embodiment of a fluid cooling housing 120 that can be used in the practice of the invention. The housing 120 includes an inner hollow tube 122 having a close end 124 and an opposite open second end 126. The inner tube 122 is mounted within an outer tube 128 having a closed end 130 (see FIG. 7) and an opposite open end 132 (see FIG. 9). The inner tube 122 is positioned in the outer tube 128 with the closed end 124 of the inner tube 122 facing and spaced from the closed end 130 of the outer tube. Four equally spaced elongated members 134-137 are between and secured to the inner tube 122 and the outer tube 128 to secure the inner tube 122 and the outer tube 128 in a fixed position relative to one another and to provide four chambers 140-143, which in this non-limiting embodiment of the invention include two inlet chambers, e.g. the chambers 140 and 142, and two outlet chambers, e.g. the chambers 141 and 143.

As mentioned above, the closed end 124 of the inner tube 122 is spaced from the closed end 130 of the outer tube 128. A baffle 145 (see FIG. 8) is securely mounted between the ends 124 and 130 to provide passageways 146 and 147 to interconnect an inlet chamber to its respective one of the outlet chamber and to isolate the passageways 146 and 147 from one another. More particularly and not limiting to the invention, the passageway 146 interconnects the chambers 140 and 141, and the passageway 147 interconnects the chambers 142 and 143, and the baffle 145 isolates the passageways 146 and 147 from one another. A ring member 148 is secured to the ends 126 and 132 of the inner and the outer tubes 122 and 128, respectively and is provided with a plurality of holes 150-153 with one of the holes 150-153 providing access to one of the chambers 140-143, respectively.

A hole 155 (clearly shown in FIG. 7) is provided in each of the tubes 122 and 128 to receive a viewing window 157. The viewing window 157 is secured between the tubes in any convenient manner to seal one or more of the chambers 140-143 in which the viewing window 157 is mounted to prevent the cooling medium from moving out of the chambers through the hole 155.

With the above arrangement, a cooling medium, e.g. chilled water flows through a conduit 159 and the hole 150 in the ring 148 into the inlet chamber 140, through the inlet chamber 140, through the passageway 146 into the outlet chamber 141, through the outlet chamber 141, and through the hole 151 in the ring 148 and conduit 160. Also a cooling medium, e.g. chilled water can be moved at the same time or at a different time through conduit 161 and the hole 152 in the ring 152 into the inlet chamber 142, through the inlet chamber 142, through the passageway 147, through the outlet chamber 143, and through the hole 153 in the ring 148 and conduit 162.

Hole 164 in the ring 148 provides an access to move a photovoltaic cell into the inner tube 122; align the photovoltaic cell with the viewing window 157, and secure the photovoltaic cell in any convenient manner in the inner tube 122. The hole 164 can be sealed in any convenient manner.

As can be appreciated, the invention is not limited to the manner, in which the photovoltaic cell is cooled, and any of the water-cooling techniques and equipment known in the art can be used in the practice of the invention to prevent thermal damage to the photovoltaic cell. In one non-limiting embodiment of the invention, the fluid cooling jacket 76 shown in FIGS. 5 and 6 is mounted and/or secured in the inner tube 122 of the housing 120 shown in FIGS. 7-9.

Further, as can be appreciated, the invention is not limited to the shape or the material of the housings 78 (FIGS. 5 and 6) and 120 (FIGS. 7-9). For example, the housings can have a circular shape as shown in FIGS. 7-9, or have a polygon shape having three or more flat (see FIGS. 5 and 6) and/or curved sides. The material of the housings 78, 120 preferably can withstand high temperatures and preferably has a melting temperature of about 200 degrees high than the temperature of the environment in which the housing is placed. Materials that can be use in the practice of the invention include, but are not limited to, metal such as, but not limited to, steel; an alloy of mainly iron and chrome sold under the registered trademark KANTHAL®, and a molybdenum disilicide sold under the trademark KANTHAL® Super. The viewing windows 87 and 157 are preferably made of a material that has a high transmittance of radiated light, e.g. greater than 70% and preferably greater than 90%, and a low absorption and reflection of infrared light, e.g. less than 20% and preferably less than 10%. Materials that can be used in the practice of the invention include but are not limited to glass, Pyrex, single crystal transparent alumina oxide, sapphire and plastic. Further the glass is preferably a low iron glass to reduce the absorption of radiated energy passing through the glass. Glass that can be used in the practice of the invention can be of the type sold by PPG Industries under the trademark Starphire.

As is appreciated by those skilled in the art, semiconductor materials used to make the photovoltaic cells are responsive to different wavelengths of the electromagnetic spectrum. Although not limiting to the invention, the inner and/or outer surface of the viewing windows 87, 157 can be coated with a layer of a filter material of the type used in the art to filter out wavelengths of the electromagnetic spectrum that the photovoltaic cell is less responsive to, to pass the wavelength of radiated light to which the photovoltaic cell is more responsive. Further transparent antireflective films, e.g. but not limited to the type disclosed in U.S. Pat. No. 3,981,292, which patent is hereby incorporated by reference, can be provided over the inner surface of the windows 87, 157 to decrease the reflective loss on the photovoltaic cell surface.

Non-limiting embodiments of the invention will be discussed with reference to the furnace 20 (FIGS. 1-3); however, it is understood that the discussion is applicable, unless indicated otherwise, to the furnace 22 (FIG. 4), and to any other furnace in which radiated light is generated by heating and/or burning materials. Further in the following discussion reference will be made to the conversion device 70. Unless indicated otherwise, reference to the conversion device 70 in the following discussion refers to a conversion device that has either the housing 78 and the fluid cooling jacket 76 (see FIGS. 5 and 6), or the fluid cooling housing 120 (see FIGS. 7-9) and the fluid cooling jacket 76, or the fluid cooling housing 120 without the fluid cooling jacket. As can be appreciated, if the device of the invention is used in an environment that is at a temperature that will not result in thermal damage to the photovoltaic cell, the device can be used without moving a cooling medium through the passageways 88 and 90 of the water cooling jacket 78, or the chambers 140-143 of the fluid cooling housing 120.

1. Mounting the Photovoltaic Cell Outside of the Heating Chamber of a Furnace.

As discussed above, the viewing portholes 60 are provided on each side of the heating chamber 26, the refiner 54 and the forming chamber (not shown) to view the operation of the glass melting process. In the instance where there are no viewing portholes in the furnace wall, a viewing porthole can be provided in the furnace wall in any convenient manner. As can now be appreciated, the conversion device 70 of the invention is mounted to or adjacent the furnace wall 46 in any convenient manner with the photovoltaic cell 72 of the conversion device 70 viewing the radiated light in the heating chamber 26 through the viewing porthole 60. As can be appreciated, in the event mounting the conversion device 70 over the viewing porthole 60 interferes with the periodic need to view the glass melting process through the viewing porthole 60, the conversion device 70 can be mounted on a system and/or stand for moving the conversion device 70 away from the viewing porthole 60, or a separate viewing porthole 60 dedicated to the conversion device 70 can be provided in the furnace wall 46, and the conversion device 70 mounted with respect to the added viewing porthole.

Figure 10:
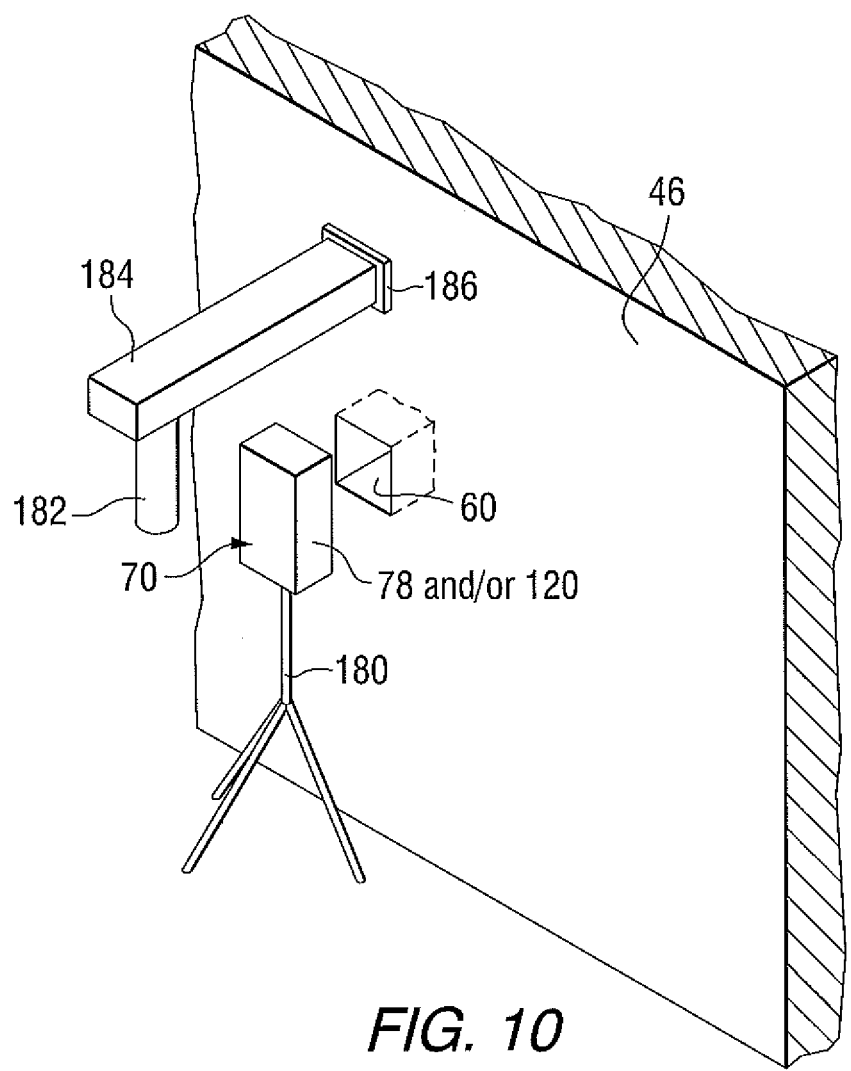
FIG. 10 is an isometric view of a wall portion of a furnace of the type shown in FIGS. 1 and 4 showing a non-limiting embodiment of the invention to position a conversion device of the invention adjacent a viewing port of a glass melting furnace.

With reference to FIG. 10 there is shown the viewing porthole 60 in one of the furnace walls 46 adjacent the opening 50 of the furnace 20 through which the batch materials 24 are feed (see FIGS. 1-3). The housing 78 or 120 of the conversion device 70 is mounted on a stand or tripod 180, and the tripod 180 and the conversion device 70 adjusted such that the viewing window 87, 157 of the conversion device 70 is aligned with the viewing porthole 60, and the photovoltaic cell 72 of the conversion device 70 (see FIGS. 5 and 6) has a view of the radiated light in the heating chamber 26. The wires 88 and 89 (see FIG. 6) and the conduits 94 and 102 (see FIG. 6), and/or 159-162 (see FIGS. 7 and 9) can be bundled together (shown as bundle 182 in FIG. 10) and secured to an overhang, e.g. but no limiting to the invention, the overhang 184 shown in FIG. 10 mounted to the furnace wall 46 at 186. With this arrangement, the tripod 180 can be easily moved to provide access the viewing porthole 60.

Figure 11:
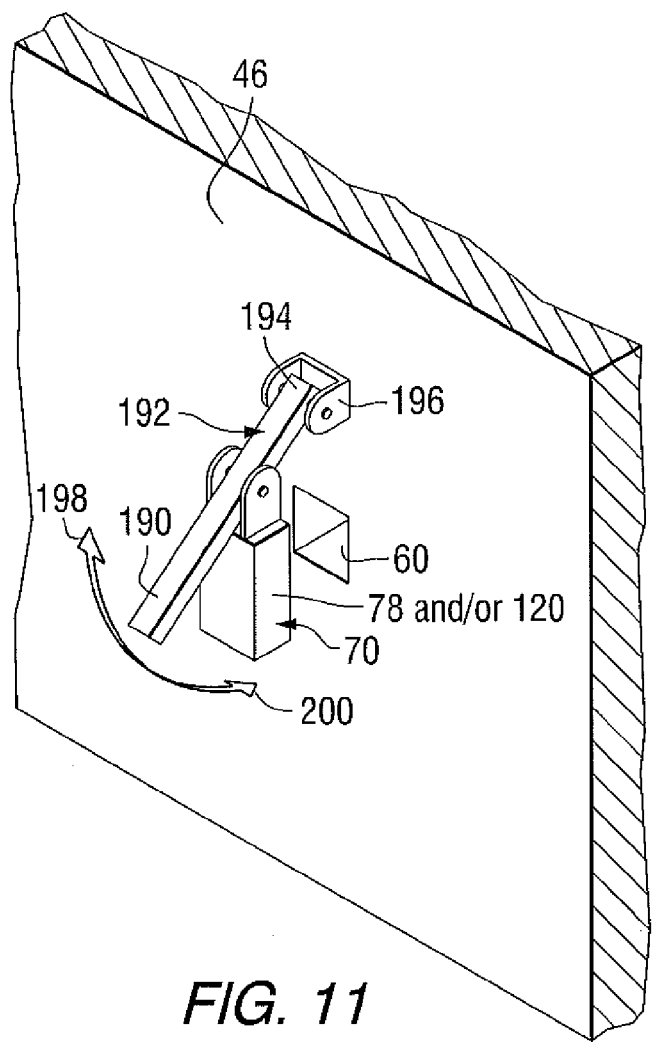
FIG. 11 is a view similar to the view of FIG. 10 showing another non-limiting embodiment of the invention to position a conversion device of the invention adjacent the viewing port of the glass melting furnace.

With reference to FIG. 11, in another non-limiting embodiment of the invention, the housing 78 or 120 of the conversion device 70 is mounted adjacent an end 190 of a shaft or elongated member 192 with opposite end 194 of the shaft 190 pivotally mounted at 196 to the wall or roof of the heating chamber (shown mounted to the wall 46 of the heating chamber in FIG. 11). With this arrangement, moving the end 190 of the shaft 192 upward in the direction of arrow head 198 moves the conversion device 70 in a clockwise direction away from the viewing porthole 60 toward a non-viewing position, and moving the end 190 of the shaft 192 in the direction of the arrow head 200 moves the conversion device 70 in a counter clockwise direction to move the viewing window 87, 157 (see FIGS. 5 and 7) of the conversion device 70 over the viewing porthole 60 in the wall 46 of the heating chamber into a viewing position. With the conversion device in a viewing position, the photovoltaic cell 72 is in a position to view the radiated light in the heating chamber 26 of the furnace 20, 22. The bundle 82 of wires and conduits (see FIG. 10) can be mounted on the member 192.

Figure 12:
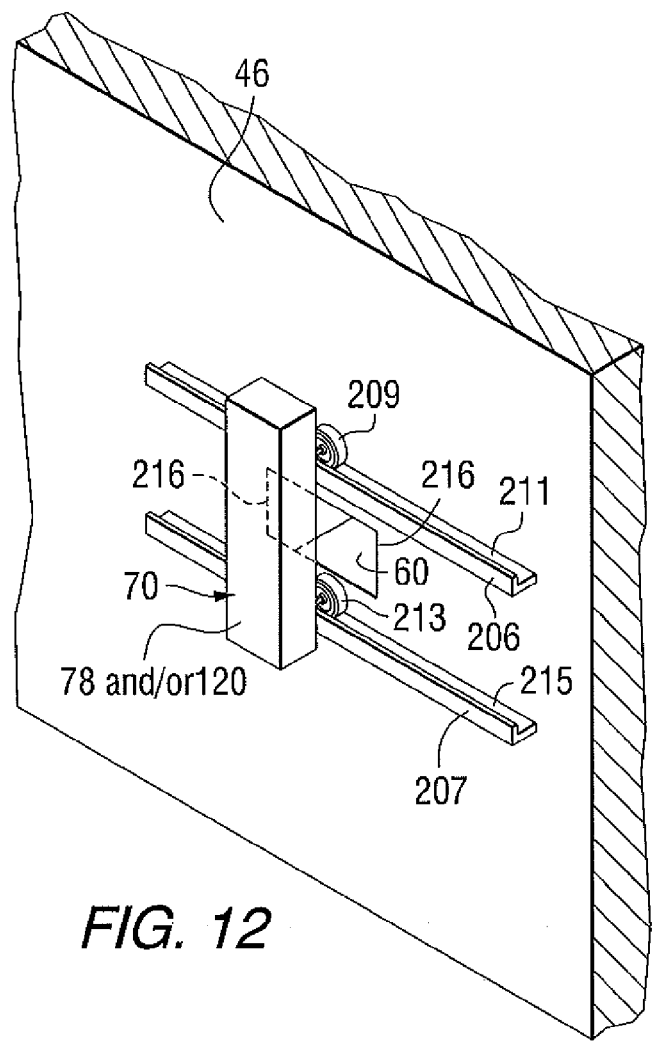
FIG. 12 is a view similar to the view of FIG. 10 showing still another non-limiting embodiment of the invention to position a conversion device of the invention adjacent the viewing port of the glass melting furnace.
Figure 13:
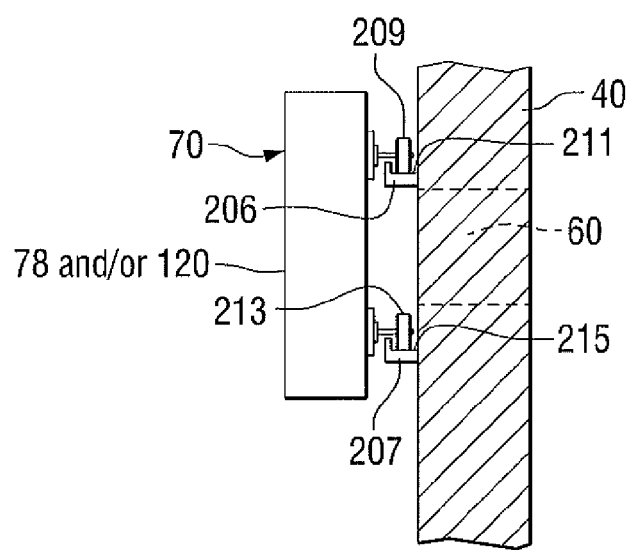
FIG. 13 is a side view of the view shown in FIG. 12.

Shown in FIGS. 12 and 13, a pair of spaced rails 206 and 207 are secured on the outer surface of the furnace wall 46 with the window 87, 157 of the conversion device 70 between the spaced rails and in facing relationship to the viewing porthole 60. An upper wheel assembly 209 securely mounted to the housing 78, 120 of the conversion device 70 engages and moves on upper surface 211 of the top rail 206, and a lower wheel assembly 213 securely mounted to the housing 78, 120 engages and moves on upper surface 215 of the lower rail 207. Preferably the rails 206 and 207 extend beyond sides 216 of the viewing porthole 60. In this manner, the conversion device 70 can be move to the left or right of the viewing porthole 60 to provide access to the viewing porthole. The bundle 182 of the wires and the conduits can be mounted overhead as shown in FIG. 10.

As can be appreciated, the invention is not limited to the mechanical arrangements discussed above to move the conversion device 70 toward and away from the viewing port 60 and any mechanical arrangement known in the art for moving articles can be used in the practice of the invention to move the conversion device toward and away from the viewing porthole 60.

Although the housings 78 and 120 with and without the fluid cooling jacket 76 can be used with the mechanical arrangements discussed above, the conversion device 70 having the housing 78 and the fluid cooling jacket 76 shown in FIGS. 5 and 6 should provide sufficient cooling to protect the photovoltaic cell 72 against thermal damage because the conversion device 70 is mounted outside the furnace 20, 22.

2. Mounting the Photovoltaic Cell in the Heating Chamber of a Furnace.

In another non-limiting embodiment of the invention, the conversion device 70 of the invention is mounted in the heating chamber 26 of the furnace 20 and the photovoltaic cell 72 directed toward the opening 50 at the upstream end of the heating chamber 26 of the furnace 22 where the batch materials 24 are heated and melted. As mentioned above, the temperature at the upstream end of the heating chamber is about 2900° F. (1593° C.); the temperature at the downstream end of the heating chamber 26 where the molten glass moves into the refiner 45 (see FIGS. 2 and 3) is about 2600° F. (1426° C.), and the temperature at the entrance end of the bath is about 2000° F. (1093° C.). As can now be appreciated, care has to be exercised to prevent thermal damage to the photovoltaic cell and the housing. Although not limiting to the invention, the conversion device 70 in this embodiment of the invention preferably includes the housing 120 (see FIGS. 7-9) and the water cooled jacket 76 (see FIGS. 5 and 6).

With reference to FIGS. 1 and 3, one or more conversion devices 70 are mounted through roof 220 of the heating chamber 26 (see FIG. 1), or the wall 46 of the heating chamber 26 (see FIG. 3, conversion devices not shown in FIG. 2) and positioned such that the viewing window 157 of the housing 120 is positioned to view the radiated light emitting from the heating and melting of the glass batch materials 24. As is appreciated, the conversion device 70 of the invention can be mounted in any part of the furnace 20, 22 where radiated light is emitted or present, e.g. in the refiner or the forming chamber of the glass making furnace. In the preferred practice of the invention, the conversion device 70 is mounted at the upstream end of the heating chamber 26 of the furnace 20 and 22.

Although the conversion device 70 can be mounted in the ceiling of the heating chamber 26, care has to be exercise not to degrade the stability of the refractories of the roof of the forming chamber. Therefore, in the practice of the invention, it preferred to mount the conversion devices 70 in the furnace wall 46.

3. Mounting the Photovoltaic Cell Outside the Furnace, and Directing the Radiated Light to Impinge of the Photovoltaic Cell.

Figure 14:
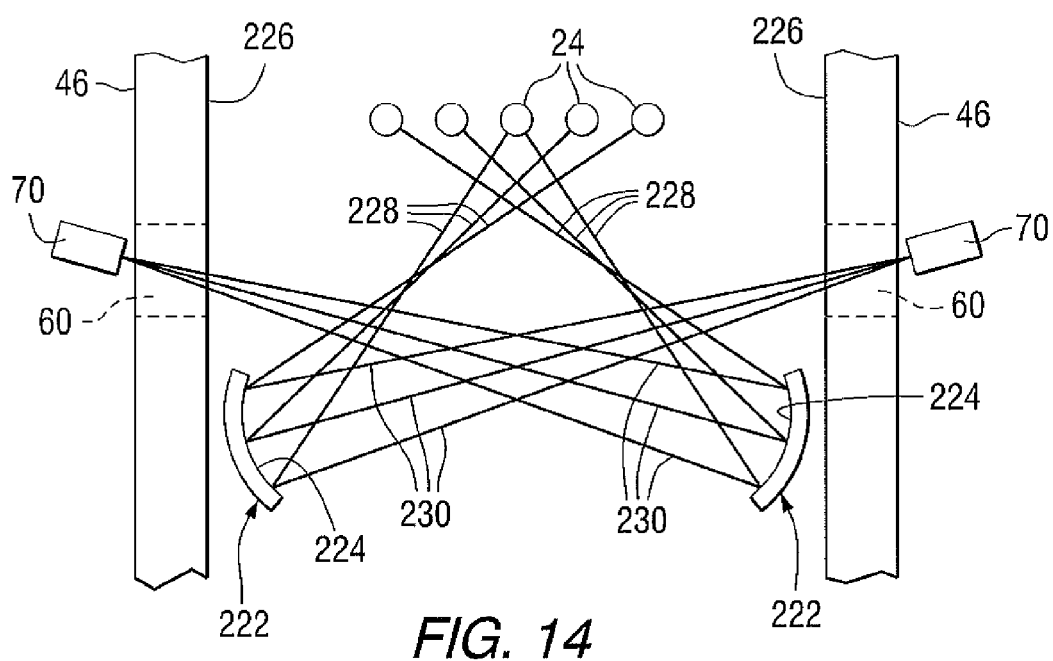
FIG. 14 is an elevated partial top view of a furnace interior having portions removed for purposes of clarity showing the reflection of red and/or infrared light from the interior of the furnace to the exterior of the furnace in accordance to the teachings of the invention.

In this non-limiting embodiment of the invention, a reflective surface, e.g. a mirror is positioned in the heating chamber to reflect the radiated light impinging on the mirror toward and through one of the viewing portholes 60 of the heating chamber 26 onto a photovoltaic cell mounted outside the heating chamber of the furnace. With reference to FIG. 14 for ease of discussion there is shown a schematic of a non-limiting embodiment of the invention that can be used to direct the radiated light out of the furnace onto a photovoltaic cell. A mirror 222 having a reflective concave surface 224 is mounted on inner surface 226 of opposed ones of the furnace walls 46 and angled such that the mirrors 222 face the melting batch materials 24. Conversion devices 70 can be mounted outside the heating chamber 26 adjacent the viewing portholes 60 of the furnace as discussed above and as shown in FIGS. 10-13.

A number of the rays 228 of the radiated light emitted from the heated batch materials 24 impinge on the concave reflective surface 224 of the mirrors 222. The rays 228 of the radiated light impinging on the reflective surface 224 of the mirror 222 are reflected as converging rays of radiated light 230 toward the conversion devices 70 mounted outside of the heating chamber 26. Preferably the photovoltaic cell of the conversion device is positioned such that the converging rays 230 impinge on the photovoltaic cell as an area general the size of the photovoltaic cell and not as a point, which could damage the cell as a result of the converging rays of the radiated light.

As can be appreciated, as the distance between the mirrors 222 and the upstream end of the furnace increases, the intensity of radiated light emitted by the heated batch materials 24 and the temperature of the heating chamber both decrease and vice versa. The spaced distance between the mirrors and the batch materials is not limiting to the invention, and the distance preferably is selected to prevent thermal damage to the mirrors and to have a dense area of rays 228 of radiated light from the heated batch materials impinging on the surface 222 of the mirror 224.

As can be appreciated, the invention is not limited to the material of the mirror and any materials that reflect infrared light can be used in the practice of the invention. The reflective surface 224 of the mirror 222 can be a layer of stainless steel, silver, bronze, gold and mixtures thereof, and coating layers of different refractive indexes to reflect radiated light while having minimum transmittance and absorption of radiated light.

Figure 15:
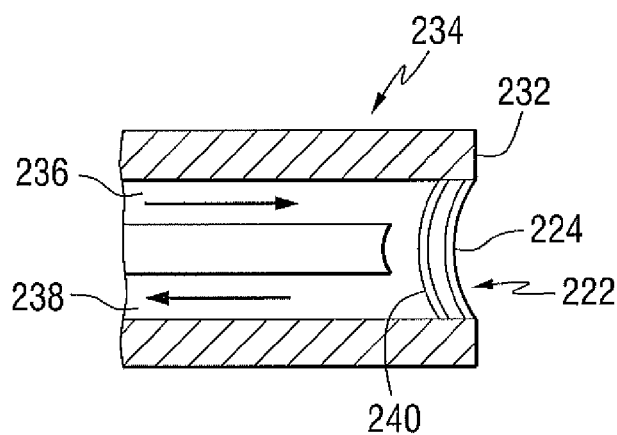
FIG. 15 is a vertical cross-sectional elevated side view of a non-limiting embodiment of a cooling tube of the invention for cooling a mirror mounted in the end of the cooling tube.

Preferably, the mirrors 222 are water cooled to prevent thermal damage to the mirrors. As is appreciated, the invention is not limited to the manner in which the mirrors are cooled and any technique known and/or used in the art can be used in the practice of the invention, e.g. and not limiting to the invention, the water cooling arrangement disclosed in U.S. patent application Ser. No. 11/958,565 titled A DEVICE FOR USE IN A FURNACE EXHAUST STREAM FOR THERMOELECTRIC GENERATION can be used in the practice of the invention. Shown in FIG. 15 is another non-limiting embodiment of the invention for cooling the mirror 222. As shown, the mirror 222 is mounted at end 232 of a fluid cooling tube 234 made of metal or a refractory material. The tube 234 has a cooling medium inlet passageway 236 and a cooling medium exit passageway 238 to move a cooling medium, e.g. but not limiting to the invention, chilled water over back surface 240 of the mirror 222 to cool the mirror surface 224.

Figure 16:
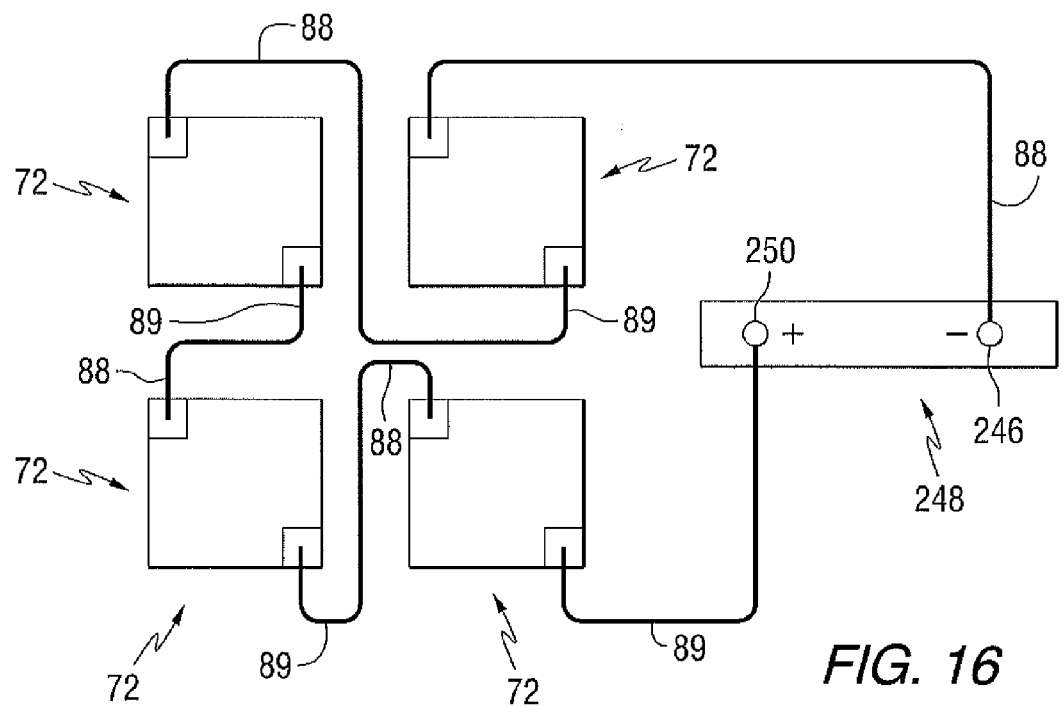
FIG. 16 is a diagram showing photovoltaic cells connected in series to an electrical load.

The invention is not limited to the use of the current generated by the photovoltaic cells 72. With reference to FIG. 16, in one non-limiting embodiment of the invention, the wire 88 connected to a negative pole of one of the photovoltaic cells 72 is connected to the wire 89 connected to a positive pole of another one of the photovoltaic cell and connections to the remaining cells made in a similar manner to electrically connect the photovoltaic cells 39 shown in FIG. 16 in series. The wire 88 of the first one of the cells connected in series is connected to negative terminal 246 of an electrical load 248, e.g. lights, and the wire 89 of the last one of the photoelectric cells connected in series is connected to positive terminal 250 of the electric load 248.

Figure 17:
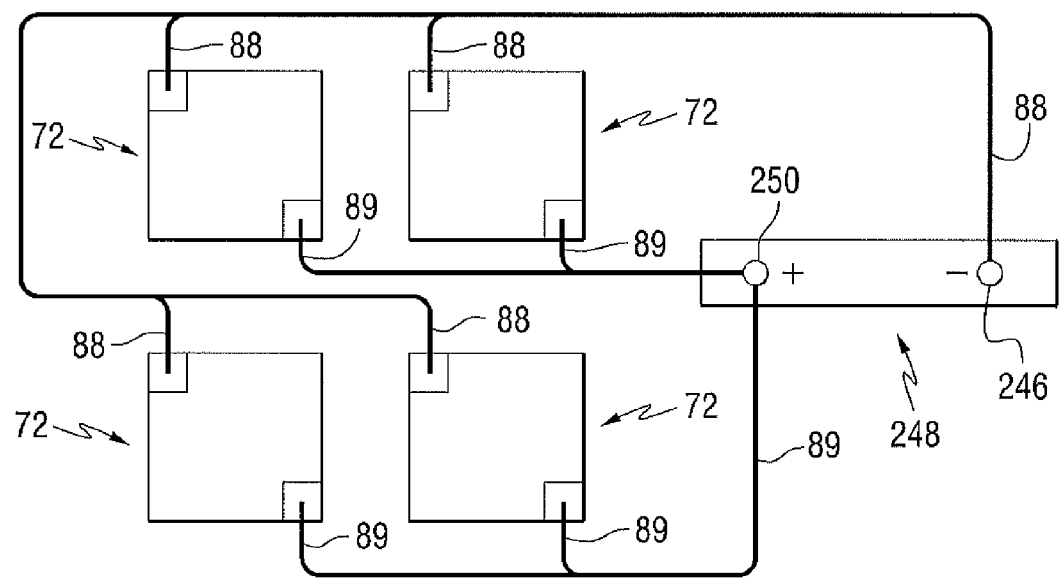
FIG. 17 is a diagram showing the photovoltaic cells connected in parallel to an electrical load.

The invention also contemplates connecting the photovoltaic cells 72 in parallel as shown in FIG. 17, i.e. the wires 88 of the photovoltaic cells 72 are connected to the negative terminal 246 of the load 248, and the wires 89 of the photovoltaic cells 72 are each connected to the positive terminal 250 of the load 248.

As can be appreciated, the invention is not limited to the embodiments of the invention discussed herein, and the scope of the invention is only limited by the scope of the following claims.

The invention claimed is:

1. In a furnace for an industrial process, the furnace comprising:
   a heating chamber to heat materials, wherein during the heating of the materials, heat is generated in the form of radiated light, wherein the generated radiated light is in a first wavelength range of the electromagnetic spectrum, an improvement comprising:
   a device for converting the heat in the form of radiated light to electric energy, the device comprising:
   a housing comprising an outer wall, a closed first end and an opposite closed second end to provide the housing with an enclosed interior;

a cooling jacket mounted within the enclosed interior of the housing, the cooling jacket extending from the first end to the second end of the housing and spaced from inner surface of the enclosed interior of the housing, the cooling jacket comprising an inlet fluid chamber and an outlet fluid chamber with access to the inlet and outlet fluid chambers at the second end of the housing;

a viewing window in the outer wall of the housing, wherein the viewing window is spaced a first distance from the first end of the housing and spaced a second distance from the second end of the housing, wherein the second distance is greater than the first distance, and a photovoltaic cell responsive to the radiated light, wherein the photovoltaic cell is mounted in a recess in the cooling jacket and is spaced from the inner surface of the enclosed interior of the housing, wherein a surface of the photovoltaic cell is in a spaced relationship to the viewing window whereby portions of the radiated light passing through the viewing window impinges on the surface of the photovoltaic cell, and an arrangement to position the device relative to the heating chamber such that the radiated light passes through the viewing window and impinge on the surface of the photovoltaic cell to convert the radiated light impinging on the surface of the photovoltaic cell to electric energy, and an electric load electrically connected to the photovoltaic cell to receive the electric energy from the device.

2. The furnace according to claim 1 wherein the generated radiated light is in a first wavelength range of the electromagnetic spectrum, and the viewing window comprising a first surface and an opposite second surface, wherein the viewing window reflects a first predetermined percent of radiated light defined as a first reflected loss of radiated light;

a transparent film over a surface of the viewing window, wherein the viewing window with the film reflects a second predetermined percent of radiated light defined as a second reflective loss of radiated light and the second reflective loss of radiated light is less than the first reflective loss of radiated light;

the photovoltaic cell responsive to radiated light having wavelengths within a second wavelength range of the electromagnetic spectrum, wherein the second wavelength range is within the first wavelength range, wherein the radiated light passing through the viewing window and through the transparent film, impinges on the surface of the photovoltaic cell, wherein the combination of the transparent film and the viewing window decreases the reflective loss of the radiated light impinging on the surface of the photovoltaic cell, and a layer of a filter material on at least one, of the surfaces of the viewing window, wherein the layer filters out the radiated light having the wavelengths outside of the second wavelength range of the electromagnetic spectrum and passes radiated light having the wavelengths within the second wavelength range of the electromagnetic spectrum wherein the radiated light having the wavelengths in the first wavelength range impinge on the viewing window and the radiated light having the wavelengths in the second wavelength range pass through the first and the second surfaces of the viewing window and the layer of the filter material and impinge on the surface of the photovoltaic cell to convert the radiated light impinging on the surface of photovoltaic cell to electric energy.

3. The furnace according to claim 2 wherein the industrial process is used to make glass, and the materials heated in the heating chamber are glass batch materials.

4. The furnace according to claim 3 wherein the heating chamber has a viewing porthole, and the arrangement and the device are mounted outside the furnace with the viewing window of the device in facing relationship to the viewing porthole of the heating chamber.

5. The furnace according to claim 4 further comprising a mirror mounted in the furnace and positioned to reflect the radiated light within the furnace toward the viewing porthole.

6. The furnace according to claim 4 wherein the arrangement comprises a system to move the device toward and away from the viewing porthole.

7. The furnace according to claim 6 wherein the moving system of the arrangement comprises a pair of tracks mounted in spaced relationship to one another on an outside wall of the furnace with the viewing porthole between the tracks, and the device mounted on the tracks for movement into a viewing position wherein the viewing window of the device views interior of the furnace, and for movement toward a non-viewing position wherein a portion of the interior of the furnace viewed through the viewing porthole is blocked from the viewing window of the device.

8. The furnace according to claim 6 wherein the moving system of the arrangement comprises an elongated member having a first end pivotally mounted to outer surface of the furnace and opposite second end mounted to the device, wherein moving the second end of the elongated member in a first direction moves the device toward the outer surface of the furnace into a viewing position, and moving the second end of the elongated member in a second direction moves the device away from the viewing porthole toward a non-viewing position.

9. The furnace according to claim 6 wherein the system is a moveable stand and the device is mounted on the moveable stand.

10. The furnace according to claim 2 wherein the device is mounted within the furnace and the housing of the device further comprises a passageway to move a cooling medium between outer walls of the housing to cool the housing and the viewing window.

11. The furnace according to claim 2 wherein the electric load is electric powered lights.

12. The furnace according to claim 2, wherein the photovoltaic cell comprises a semiconductor material embedded in a transparent plastic fitted with a frame, a transparent substrate over the semiconductor material, and a film on a surface of the transparent substrate, wherein the film and the transparent substrate of the photovoltaic cell are between the viewing window and the semiconductor material, wherein the reflective loss of the radiated light by the transparent substrate without the film is greater than the reflective loss of the radiated light by the transparent substrate having the film.

13. The furnace according to claim 12 wherein the heat generated by the heating of the materials is waste heat.

14. A method of converting heat from an industrial process to electric current, comprising:

operating the industrial process to heat materials, wherein the heated materials generate heat in the form of radiated light, wherein the radiated light is in a first wavelength range of the electromagnetic spectrum;

providing a device for converting the heat in the form of radiated light to electric energy, the device comprising:

a housing comprising an outer wall, a closed first end and an opposite closed second end to provide the housing with an enclosed interior;

a cooling jacket mounted within the enclosed interior of the housing, the cooling jacket extending from the first end to the second end of the housing and spaced from inner surface of the enclosed interior of the housing, the cooling jacket comprising an, inlet fluid chamber and an outlet fluid chamber with access to the inlet and outlet fluid chambers at the second end of the housing;

a viewing window in the outer wall of the housing wherein the viewing window is spaced a first distance from the first end of the housing and spaced a second distance from the second end of the housing, wherein the second distance is greater than the first distance, and the viewing window reflects a first predetermined percent of radiated light defined as a first reflected loss of radiated light;

a transparent film over a surface of the viewing window, wherein the viewing window with the film reflects a second predetermined percent of radiated light defined as a second reflective loss of radiated light and the second reflective loss of radiated light is less than the first reflective loss of radiated light;

a layer of a filter material on at least one of the surfaces of the viewing window, wherein the layer of the filter material filters out the radiated light having the wavelengths outside of the first wavelength range of the electromagnetic spectrum and passes radiated light having the wavelengths within the first wavelength range of the electromagnetic spectrum, and a photovoltaic cell responsive to the radiated light, wherein the photovoltaic cell is mounted in a recess in the cooling jacket and is spaced from inner surface of the enclosed interior of the housing, wherein a surface of the photovoltaic cell is in a spaced relationship to the viewing window whereby the radiated light impinging on the first surface of the viewing window passes through the viewing window and impinges on the surface of the photovoltaic cell;

passing the radiated light having the wavelengths within the first wavelength range of the electromagnetic spectrum through a layer of a filtering material to pass the radiated light having wavelengths within a second wavelength range of the electromagnetic spectrum, wherein the second wavelength range is within the first wavelength range;

passing the radiated light having the wavelengths within the second wavelength range of the electromagnetic spectrum through a transparent antireflective film to decrease the reflective loss of the wavelengths in the second wavelength range of the electromagnetic spectrum passing through the transparent film;

impinging the radiated light passing through the film onto a surface of a photovoltaic cell to generate electric current, and passing the electric current from the photovoltaic cell to an electric load.

15. The method according to claim 14 wherein the heat generated by the heating of the materials is waste heat and the electric load is electric powered lights.

\* \* \* \* \*